US008498856B2

(12) United States Patent
Kataoka et al.

(10) Patent No.: US 8,498,856 B2
(45) Date of Patent: Jul. 30, 2013

(54) SIMULATION METHOD, SYSTEM AND PROGRAM

(75) Inventors: Masaki Kataoka, Kanagawa-ken (JP);
Hideaki Komatsu, Kanagawa-ken (JP);
Goh Kondoh, Kanagawa-ken (JP);
Fumitomo Ohsawa, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 12/834,081

(22) Filed: Jul. 12, 2010

(65) Prior Publication Data
US 2011/0015916 A1   Jan. 20, 2011

(30) Foreign Application Priority Data
Jul. 14, 2009   (JP) ................. 2009-165698

(51) Int. Cl.
G06F 17/50 (2006.01)
G06F 7/60 (2006.01)
G06G 7/48 (2006.01)

(52) U.S. Cl.
USPC .............. 703/19; 703/1; 703/2; 703/6; 703/7; 703/8; 703/13; 703/14; 703/15

(58) Field of Classification Search
None
See application file for complete search history.

(56) References Cited

U.S. PATENT DOCUMENTS

| | | | | |
|---|---|---|---|---|
| 5,187,785 A * | 2/1993 | Shah | ................. | 714/25 |
| 6,438,734 B1 * | 8/2002 | Lu | ................. | 716/106 |
| 7,162,704 B2 * | 1/2007 | Oktem | ................. | 716/114 |
| 7,178,112 B1 * | 2/2007 | Ciolfi et al. | ................. | 703/2 |
| 7,222,218 B2 * | 5/2007 | Dutt et al. | ................. | 711/125 |
| 7,346,902 B2 * | 3/2008 | Dutt et al. | ................. | 717/149 |
| 7,614,037 B2 * | 11/2009 | Gavrilov | ................. | 717/105 |
| 7,681,151 B2 * | 3/2010 | Ciolfi et al. | ................. | 716/116 |
| 7,801,715 B2 * | 9/2010 | Ciolfi et al. | ................. | 703/13 |
| 7,809,545 B2 * | 10/2010 | Ciolfi et al. | ................. | 703/22 |
| 7,992,111 B1 * | 8/2011 | Ma et al. | ................. | 716/103 |
| 2006/0290311 A1 * | 12/2006 | Chopra et al. | ........... | 318/568.11 |
| 2007/0157138 A1 * | 7/2007 | Ciolfi et al. | ................. | 716/4 |
| 2008/0005357 A1 * | 1/2008 | Malkhi et al. | ................. | 709/248 |
| 2008/0279204 A1 * | 11/2008 | Pratt et al. | ................. | 370/406 |

FOREIGN PATENT DOCUMENTS

| | | | |
|---|---|---|---|
| JP | PUPA 2001-101156 | | 4/2001 |
| JP | 2001290860 | A | 10/2001 |
| JP | PUPA 2002-318990 | | 10/2002 |
| JP | 2003177943 | A | 6/2003 |
| JP | 2006350549 | A | 12/2006 |
| JP | 2009003683 | A | 1/2009 |

OTHER PUBLICATIONS

Ren et al. "Information Consensus in Multivehicle Cooperative Control", IEEE Control Systems Magazine, 2007.*
Posse et al. "Processing Causal Block Diagrams with Graph Grammars in AToM".*
OSCI TLM-2.0, Software Version: TLM-2.0, Document Version JA22, Copyright: 2007-2008—User Manual (151 pages)—http://cs.tju.edu.cn/faculty/weiguo/%E9%AB%98%E7%BA%A7VLSI%E8%AE%BE%E8%AE%A1/SystemC_TLM/TLM_2_0_user_manual.pdf.

* cited by examiner

Primary Examiner — Shambhavi Patel
(74) Attorney, Agent, or Firm — Jon A. Gibbons; Fleit Gibbons Gutman Bongini & Bianco PL

(57) ABSTRACT

A simulation system having multiple peripherals that communicate with each other. The system includes a weighted graph with weights set as communication times. The peripherals are represented as nodes and connection paths are represented as edges. Among the communication times in the loop, the minimum time is set as first synchronization timing. Timing with an acceptable delay added is set as second synchronization timing. Timing set by a user to be longer than the first and second timings is set as third synchronization timing. The third synchronization timing is used in a portion where the timing is usable, thus synchronizing the peripherals at the longest possible synchronization timing.

12 Claims, 14 Drawing Sheets

SIMULATION METHOD, SYSTEM AND PROGRAM

CROSS REFERENCE TO RELATED APPLICATION

This application claims priority under 35 U.S.C. 119 from Japanese Patent Application 2009-165698, filed Jul. 14, 2009, the entire contents of which are incorporated herein by reference.

BACKGROUND OF THE INVENTION

1. Field of the Invention

The present invention relates to the simulation of a physical system such as an automobile, and more particularly to a software-based simulation system.

2. Description of Related Art

In the early 20th century, an automobile was made up of an engine as a power source, and mechanical parts including a brake, an accelerator, a steering wheel, a transmission, and a suspension, with little use of electrical mechanisms except for an ignition plug for the engine and headlights.

However, around the 1970s, there arose the need to control the engine efficiently in preparation for air pollutions, oil crisis, and the like. Thus, an engine control unit (ECU) started to be used for engine control. In general, the ECU includes an input interface used, for example, for A/D conversion of an input signal from a sensor, a logical operation unit (microcomputer) for processing a digital input signal according to predetermined logic, and an output interface for converting the processing result into an actuator operating signal.

A significant proportion of a recent automobile is now occupied not only by mechanical parts but also by electronic components and software, which range from control systems for the engine and the transmission, an anti-lock braking system (ABS), electronic stability control (ESC), and a power steering, to wiper control, a security monitoring system, and the like. The development cost for the latter is said to be 25% or 40% of the total cost, and accounts for 70% in a hybrid car.

Multiple ECUs are arranged to provide electronic control. The ECUs are connected to each other via an in-vehicle network such as a controller area network (CAN). The engine, the transmission, and the like, which are to be controlled, are wire-connected directly to the respective ECUs.

The ECU is a small computer, and is operated according to an interrupt from a sensor input or the like. Meanwhile, the engine and the like continuously perform mechanical operations. In other words, a computer digital system and a mechanical physical system perform cooperative operations in parallel in a single system as an automobile. Naturally, software supporting those operations has become more and more complicated. Therefore, it is desired to achieve a mechanism not only for verifying the operation of a single ECU but also for verifying the operations of multiple ECUs at the same time.

Meanwhile, actuators driven by output signals from respective ECUs include an electromagnetic solenoid, a motor, etc. The solenoid is used, for example, for an injector of the engine, shift control of the transmission, brake valve control, door lock, and the like.

As a conventional technique for testing such devices, there is HILS (Hardware In the Loop Simulation). Particularly, an environment for testing all the ECUs in the automobile is called full-vehicle HILS. In the full-vehicle HILS, a test is conducted in a laboratory according to a predetermined scenario by connecting a real ECU to a dedicated hardware device emulating an engine, a transmission mechanism, or the like. The output from the ECU is input to a monitoring computer, and further displayed on a display to allow a person in charge of the test to check if there is any abnormal action while viewing the display.

However, in HILS, the dedicated hardware device is used and the device and the real ECU have to be physically wired. Thus, HILS involves a lot of preparation. Further, when a test is conducted by replacing one ECU with another, the device and the ECU have to be physically reconnected, requiring even more work. Since the test uses the real ECU, it takes actual time to conduct the test. Therefore, it takes an immense amount of time to test many scenarios. In addition, the hardware device for emulation of HILS is generally very expensive.

Therefore, there has recently been a technique using software without using such an expensive emulation hardware device. This technique is called SILS (Software In the Loop Simulation), in which all components to be mounted in the ECU, such as a microcomputer, an I/O circuit, and a control scenario, are configured by using a software simulator. This enables the test to be conducted without the hardware of the ECU.

A simulation system for automobiles includes a continuous system simulator and a discrete system (discrete event) simulator. An example of the continuous system simulator is a simulator for simulating a mechanical part of the engine. An example of the discrete event simulator is a simulator for an ECU operated with pulse timing of the engine rotation to control the timing of fuel injection or ignition.

For simulation of a 4WD, there is a simulator for repeatedly calculating the behavior of the car from the torque distribution to each wheel as an example of the continuous system simulator, and there is a simulator operated with a periodic pulse signal output at every interval of 10 milliseconds to simulate an ECU to determine the torque distribution to each wheel from a sensor input such as the yaw rate of the car as an example of the discrete event simulator.

The discrete event simulator reads and writes data through an I/O port other than input of pulse signals asynchronously with respect to the time slices of the continuous system simulator. Typically, it reads data from a sensor and updates it.

An ECU emulator as a typical discrete event simulator consists of CPU emulators and peripherals that interface the CPU emulators with the continuous system simulator.

The simulation of peripherals is a particular problem in such a simulator. Since the peripherals are of many kinds and their operation timings vary from peripheral to peripheral, it is difficult to configure the simulation system to operate correctly.

One solution is to run a peripheral emulator step by step while faithfully following hardware descriptions provided by an ECU vendor.

The TLM 2.0 user manual (June 2008) gives a description about "Loosely-timed coding style and temporal decoupling" at Chapter 3.3.2.

Japanese Patent Application Publication No. 2001-101156 discloses a system for automatically estimating an optimum simulation parameter. The system includes a parameter variation setting dialog window used for setting a start value, a variable step width, and an end value to create a parameter variation table in order to enable an objective judgment of the consistency between raw data and simulation data, and a data comparison module for evaluating the degree of similarity between the result of simulated calculation and comparative data, in which the simulated calculation is performed on all conditions in the parameter variation table to evaluate the degree of similarity between the calculation result and the comparative data so as to estimate the optimum simulation parameter.

Japanese Patent Application Publication No. 2002-318990 discloses a simulation system, in which processing is performed in a known state up to the jth step, and a predictor and a corrector are calculated at the j+1th step to determine whether an estimate of error is smaller than an error tolerance. When the result of determination is "Yes," the next step width or solution is calculated and processing is advanced by one step. When the result of determination is "No," the step width is reduced or processing is returned by one step.

With the above conventional techniques the simulation system is operated at more relaxed timing than previously and the operation conditions are changed as required. However, adjustment of operation timing among multiple functional blocks, such as peripherals, different in operating condition is neither disclosed nor suggested.

SUMMARY OF THE INVENTION

In accordance with one aspect of the present invention, a method of operating a system having connected functional blocks includes the steps of: configuring a first graph in which nodes represent the functional blocks and edges having weights as communication times represent connection paths among the functional blocks, the graph being derived from connection relationships among the functional blocks and the communication times through the connection paths; finding closed paths in the graph; determining the closed path having the lowest weight among the closed paths found; storing the weight of the closed path having the lowest weight as a first synchronization timing; and synchronizing the functional blocks at the first synchronization timing.

In accordance with another aspect of the present invention, a system including connected functional blocks includes: means for configuring a graph, where the functional blocks are represented as nodes and connection paths are represented as edges having weights as communication times, from connection relationships among the functional blocks and the communication times through the connection paths; means for finding closed paths in the graph; means for determining a closed path having the lowest weight among the closed paths found; means for storing a weight of the closed path having the lowest weight as a first synchronization timing; and means for synchronizing the functional blocks at the first synchronization timing.

In accordance with a further aspect of the present invention, a computer program is provided that, when executed by a data processing system, causes the system to perform the steps of the method described above.

DETAILED DESCRIPTION OF THE PREFERRED EMBODIMENT

Figure 1:
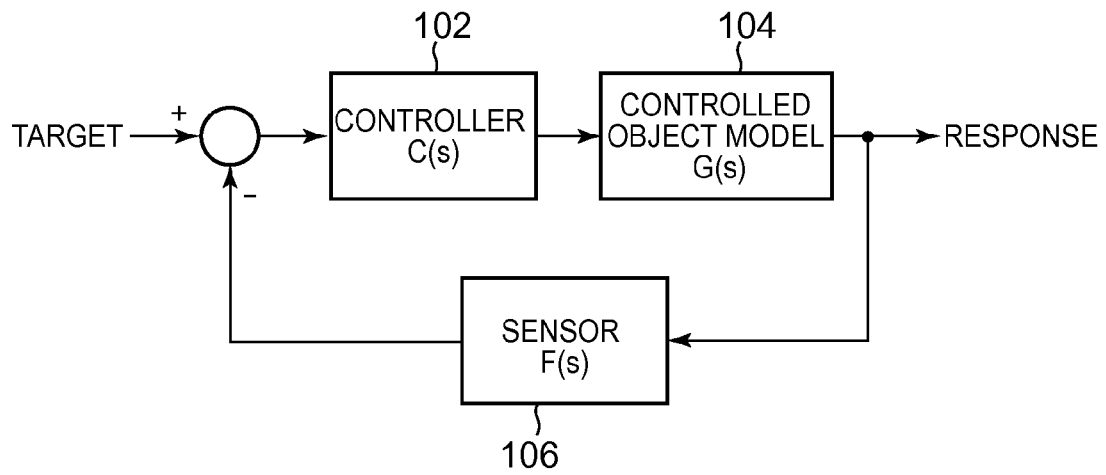
FIG. 1 is a diagram showing an example of a feedback closed-loop system as typical ECU control.

In the preferred embodiment of the present invention, hardware specifications of logical blocks as peripheral modules of a typical ECU are written in a description language such as System C.

The hardware specifications thus written in System C are scanned by a predetermined scan tool and, based on the hardware specifications, a graph including nodes representing the peripheral modules and edges, each having a weight, as communication time between peripheral modules is created preferably on a memory of a computer.

The graph thus created is searched for on the computer, and a loop is extracted. Path lengths are calculated for the extracted loop based on the weights of the edges. Among the calculated path lengths, the minimum one is stored as $\Delta T\_peri$ in the memory of the computer. In the present invention, the operation in a synchronization cycle having $\Delta T\_peri$ is called the operation in a strong coupling model.

Next, values for synchronization more relaxed by an acceptable delay set by a user based on the specifications and experience are determined for a loop extracted in the same manner. The lowest of the values is stored as $\Delta T\_peri'$ in the memory of the computer. In the present invention, the operation in a synchronization cycle having $\Delta T\_peri'$ is called the operation in a weak coupling model.

According to the present invention, it is then checked whether a peripheral in a loop and a peripheral in another loop can communicate with each other in $\Delta T\_major$ longer than $\Delta T\_peri$ and $\Delta T\_peri'$, and if so, communication is performed in $\Delta T\_major$. In the present invention, the operation in a longer synchronization cycle allowed between the peripheral in one loop and the peripheral in the other loop is called the operation in an aggregate model of synchronization cycle between peripherals.

According to the present invention, it is further checked whether a peripheral and a plant can communicate with each other in an aggregated synchronization cycle ΔT_major. If so, communication is performed in ΔT_major. In the present invention, the operation in a longer synchronization cycle allowed between the peripheral and the plant is called the operation in an aggregate model of synchronization cycle between the peripheral and the plant.

When preparing such a scheme in the simulation system, operation in the strong coupling model is first tried. If a desired operation speed can be obtained, the simulation system is executed in the strong coupling model.

If not, operation in the weak coupling model is next tried. If a desired operation speed can be obtained, the simulation system is executed in the weak coupling model.

If not, operation in the aggregate model of synchronization cycle between peripherals is next tried. If a desired operation speed can be obtained, the simulation system is executed in the aggregate model of synchronization cycle between peripherals.

If not, the simulation system is executed in the aggregate model of synchronization cycle between a peripheral and a plant.

According to the present invention, the synchronization timing is gradually relaxed in the simulation system based on the description of the specifications so that the highest possible operation speed can be achieved while maintaining the accuracy of the operation.

The present invention enables adjustment of synchronization timing among multiple logical blocks connected to each other in a simulation system where the multiple logical blocks have different operating conditions such as peripherals of an ECU. This improves operation speed.

A configuration and processing of one preferred embodiment of the present invention is now described with reference to the accompanying drawings. In the following description, the same components are denoted by the same reference numerals throughout the drawings. Although the configuration and processing are described here as one preferred embodiment, it should be understood that the technical scope of present invention is not intended to be limited to this embodiment.

Before describing a specific configuration to carry out the present invention, a description is given of an exemplary ECU. In general, the ECU includes an input interface for converting, e.g., A/D converting an input signal from a sensor, a logical operation unit (microcomputer) for processing a digital input signal according to predetermined logic, and an output interface for converting the processing result into an actuator operating signal.

The following describes the present invention in association with ECUs for an automobile for convenience, but the invention is not limited thereto. It should be understood that the present invention is widely applicable to other mechatronics products using ECUs such as aircrafts and robots.

The ECU detects, using sensors, the ambient or environmental situation, states of drive mechanisms such as an engine, and the content of human operations to give instructions, and inputs them as signals. Specifically, there are signals from a water temperature sensor, an intake-air temperature sensor, a boost pressure sensor, a pump angle sensor, a crank angle sensor, a vehicle speed sensor, an accelerator position sensor, an A/T shift position, a starter switch, an air conditioning ECU, and the like.

The ECU inputs these signals and outputs signals to drive an electromagnetic spill valve, a fuel cut solenoid, a timing control valve, an intake throttle VSV, a glow plug relay, a tachometer, an air conditioning relay, and the like.

Though not necessarily impossible for one ECU to output drive signals to control several different mechanisms, it is not reasonable for a single ECU to control mechanisms different in responsiveness and control strictness, such as the engine and the air conditioner. Therefore, several ECUs are generally provided in an automobile.

FIG. 1 is a diagram showing an example of a feedback closed-loop system as typical ECU control. In FIG. 1, when a certain target signal is input into a controller 102 as an ECU, the ECU internally processes the target signal and outputs a drive signal to drive a plant 104 like an engine as a controlled object model. Then, the output of the plant 104 is fed back to the input of the controller 102 through a sensor 106.

Given here as target signals are parameters, such as throttle position, idle control, braking force, shift, starter ON/OFF, battery voltage, injection excitation time, number of injection excitations, deposit, dwell angle, spark advance valve, intake completion flag, ignition completion flag, atmospheric pressure, vehicle weight, rolling resistance coefficient, road gradient, adhesion coefficient, intake air temperature, etc.

Further, fed back as sensor signals are throttle position, intake air pressure, intake air quantity, shift, engine speed, vehicle speed, exhaust gas temperature, $O_2$, cooling water temperature, air fuel ratio, knock, ignition anomaly, etc.

An object to be controlled by an ECU is a mechanical system solved using the Newtonian equation of motion, an electric driven circuit solved using a response equation of the electric circuit, or a combination thereof. These are basically differential equations, and in control engineering, they can be described by response functions using the Laplace transform.

Figure 2:
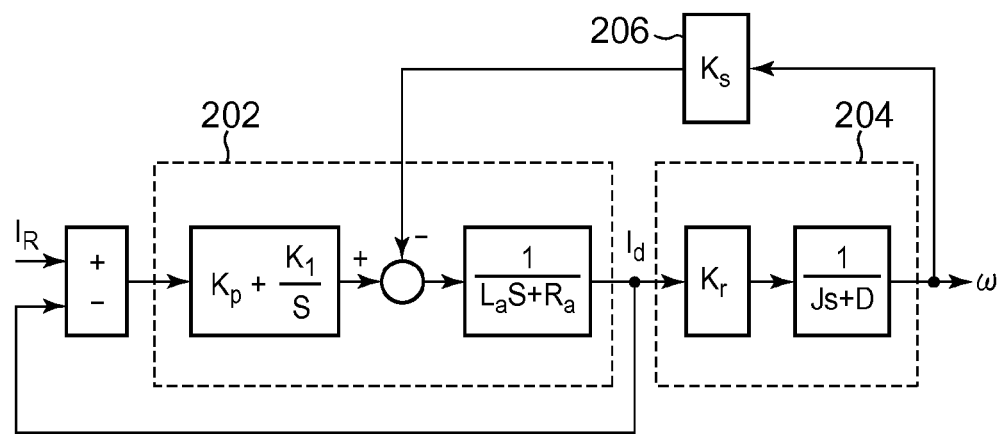
FIG. 2 shows an example of description using a response function.

FIG. 2 shows an example of the description of such a response function. In FIG. 2, a portion enclosed by a broken line 202 corresponds to the controller 102 in FIG. 1, a portion enclosed by a broken line 204 corresponds to the controlled object model 104 in FIG. 1, and a block 206 corresponds to the sensor 106. It is to be understood that FIG. 2 is just an illustrative example of the representation of a response function and is not intended to limit the present invention.

Figure 3:
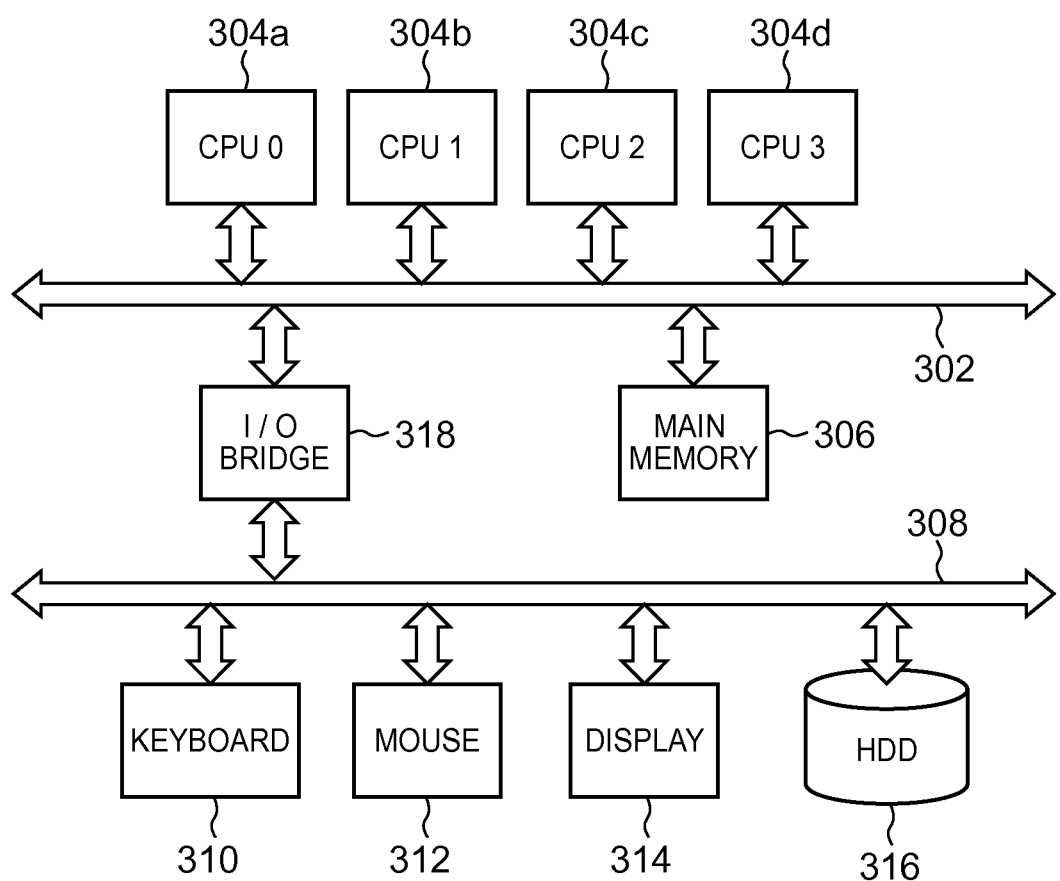
FIG. 3 is a block diagram of a hardware configuration for carrying out the present invention.

Referring next to FIG. 3, the hardware of a computer used to carry out the present invention is described. In FIG. 3, plural CPUs, i.e., CPU0 304a, CPU1 304b, CPU2 304c, and CPU3 304d, are connected to a host bus 302. A main memory 306 is also connected to the host bus 302 to provide the CPU0 304a, CPU1 304b, CPU2 304c, and CPU3 304d with memory spaces for arithmetic processing.

On the other hand, a keyboard 310, a mouse 312, a display 314, and a hard disk drive 316 are connected to an I/O bus 308. The I/O bus 308 is connected to the host bus 302 through an I/O bridge 318. The keyboard 310 and the mouse 312 are used by an operator to perform operations, such as to enter a command and click on a menu. The display 314 is used to display a menu on a GUI to operate, as required, a program according to the present invention to be described later.

IBM® System X can be used as the hardware of a computer system suitable for this purpose. In this case, for example, Intel® Core 2 DUO may be used for CPU0 304a, CPU1 304b, CPU2 304c, and CPU3 304d, and the operating system may be Windows® Server 2003. The operating system is stored in the hard disk drive 316, and read from the hard disk drive 316 into the main memory 306 upon startup of the computer system.

Four CPUs are shown here, but the number of CPUs is not limited thereto. The computer system may be a single processor system, a multi-core system with any number of multiple cores, or a multiprocessor system.

Note that the hardware of the computer system usable for carrying out the present invention is not limited to IBM® System X and any other computer system can be used as long as it can run a simulation program of the present invention. The operating system is also not limited to Windows®, and any other operating system such as Linux® or Mac OS® can be used. Further, a POWER® 6-based computer system such as IBM® System P with operating system AIX® may also be used to run logical processes such as an ECU emulator program and a plant simulator at high speed.

Also stored in the hard disk drive 316 are plural logical processes, such as the ECU emulator and the plant simulator, and programs for running the plural logical processes in corporation therewith in a manner to be started and manipulated through the keyboard 310 and the mouse 312.

In order to realize full-vehicle SILS, it is preferred that all the ECU emulator programs and peripheral emulators, which interface the ECU emulators program with the plant simulators, used in one automobile be stored in the hard disk drive 316.

Further stored in the hard disk drive 316 are data, program modules, and the plant simulators to be described later with reference to FIG. 4.

Note the use of the terms "emulator" and "simulator" here. An ECU code originally written by assuming that the code runs on another processor is set to run using CPU0 to CPU3 and the like as targets. This is called emulation and a program for performing the emulation is called an emulator. Meanwhile, a system for virtually calculating the operation of a physical system such as the engine is called a simulator.

Figure 4:
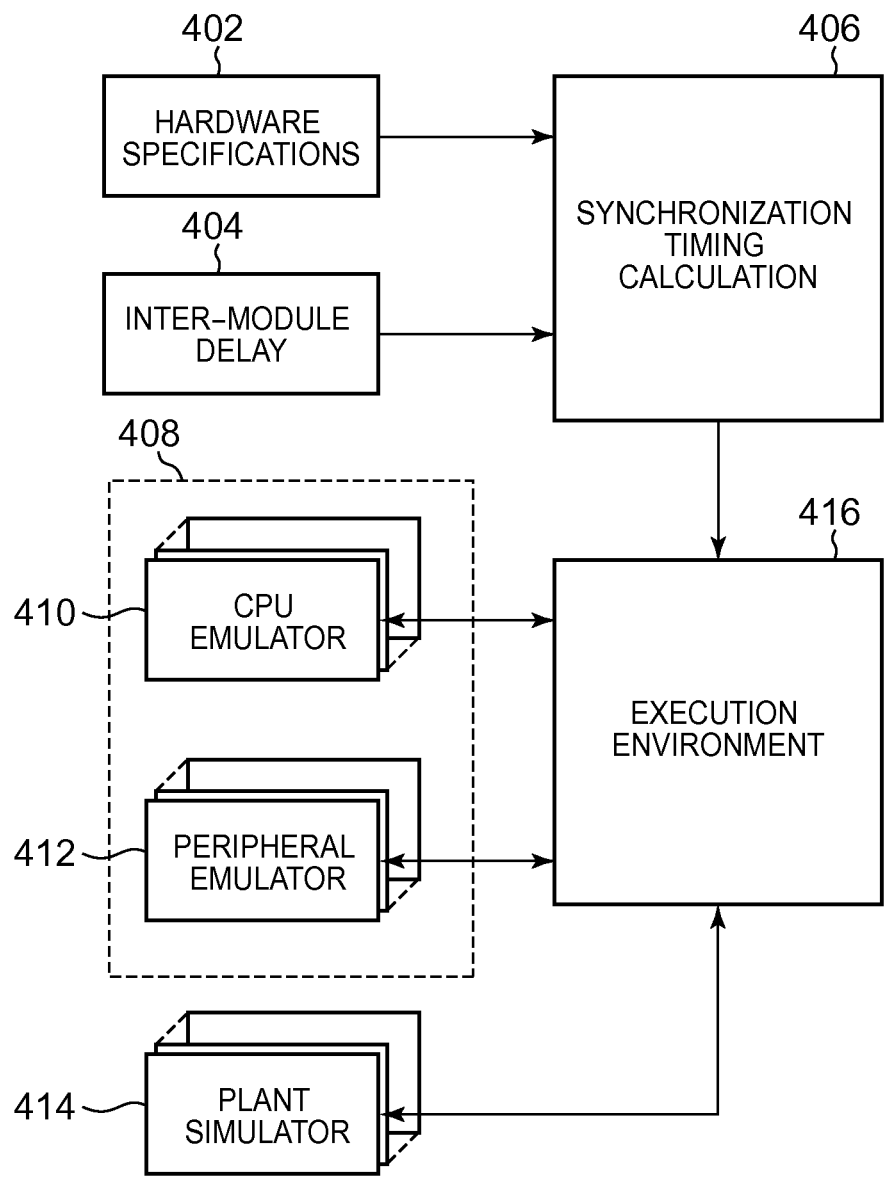
FIG. 4 is a functional block diagram of data, a module, and an execution environment for carrying out the present invention.

FIG. 4 is a functional block diagram of data, a module, and an execution environment for carrying out the present invention. In FIG. 4, hardware specifications 402 is a file stored in a computer-readable medium, such as the hard disk drive 316, and written in System C, for example. The following shows an example of description in System C.

In the following, the delay time in communication is described in the 16th line of peripheral_a.cpp:

description is made as sc_time*time=new sc_time(50, SC_NS); //communication delay is 50 ns Communication from A to B is described in the 24th line of peripheral_a.cpp 24:

i_socket→b_transport(*trans, *time);

Communication from B to A corresponds to return from b_transport of peripheral_a.cpp.

The processing time of B and the delay time in communication are described in the 12th line of peripheral_b.cpp 12:

sc_time*delay=new sc_time(100, SC_NS); //processing time and communication delay are 100 ns

```
// peripheral_a.h
#ifndef PERIPHERAL_A_H_
#define PERIPHERAL_A_H_
#include <systemc>
#include <tlm.h>
using namespace sc_core;
using namespace sc_dt;
using namespace std;
using namespace tlm;
SC_MODULE(PERIPHERAL_A), tlm_bw_transport_if<>
{
public:
  tlm_initiator_socket<32> i_socket;
  SC_HAS_PROCESS(PERIPHERAL_A);
  PERIPHERAL_A(sc_module_name);
protected:
  virtual tlm_sync_enum nb_transport_bw(tlm_generic_payload&,
tlm_phase&, sc_time&);
  virtual void invalidate_direct_mem_ptr(uint64, uint64);
  void thread0(void);
};
// end of peripheral_a.h
#endif
// peripheral_a.cpp
#include "peripheral_a.h"
PERIPHERAL_A::PERIPHERAL_A(sc_module_name name)
  : sc_module(name)
  , i_socket("i_socket")
{
  i_socket.bind(*this);
  SC_THREAD(thread0);
}
void PERIPHERAL_A::thread0(void)
{
  tlm_generic_payload* trans = new tlm_generic_payload;
  int write_value = 100;
  sc_time* time = new sc_time(50, SC_NS); // communication delay is 50ns
  trans->set_address(0x0);
  trans->set_data_ptr(RCAST<unsigned char *>(&write_value));
  trans->set_data_length(4);
  trans->set_write( );
  // communication start
  i_socket->b_transport(*trans, *time);
  // the value of "time" is 150ns here
  cout << time->to_string( ) << endl;
  if (trans->is_response_error( )) {
    //error processing
  }
  delete trans;
  delete time;
}
tlm_sync_enum PERIPHERAL_A::nb_transport_bw(tlm_generic_payload&
trans, tlm_phase& phase, sc_time& t)
{
  trans.set_response_status(TLM_GENERIC_ERROR_RESPONSE);
  return TLM_COMPLETED;
}
void PERIPHERAL_A::invalidate_direct_mem_ptr(uint64 a, uint64 b)
{
}
// end of peripheral_a.cpp
// peripheral_b.h
#ifndef PERIPHERAL_B_H
#define PERIPHERAL_B_H
#include <systemc>
#include <tlm.h>
using namespace sc_core;
using namespace sc_dt;
using namespace std;
using namespace tlm;
SC_MODULE(PERIPHERAL_B), tlm_fw_transport_if<>
{
public:
  tlm_target_socket<32> t_socket;
  SC_HAS_PROCESS(PERIPHERAL_B);
  PERIPHERAL_B(sc_module_name);
protected:
  virtual void b_transport(tlm_generic_payload&, sc_time&);
  virtual tlm_sync_enum nb_transport_fw(tlm_generic_payload&,
tlm_phase&, sc_time&);
  virtual unsigned int transport_dbg(tlm_generic_payload&);
  virtual bool get_direct_mem_ptr(tlm_generic_payload&, tlm_dmi&);
};
#endif
// end of peripheral_b.h
// peripheral_b.cpp
#include "peripheral_b.h"
```

-continued

```
PERIPHERAL_B::PERIPHERAL_B(sc_module_name name)
  : sc_module(name)
  , t_socker("t_socket")
{
  t_socket.bind(*this);
}
void PERIPHERAL_B::b_transport(tlm_generic_payload& trans,
sc_time& t)
{
  sc_time* delay = new sc_time(100, SC_NS); // processing time and
communication delay are 100ns
  // process descriptions of peripheral_b
  t = t + *delay;
  delete delay;
}
tlm_sync_enum
PERIPHERAL_B::nb_transport_fw(tlm_generic_payload& trans,
tlm_phase& phase, sc_time& t)
{
  return TLM_COMPLETED;
}
unsigned int
PERIPHERAL_B::transport_dbg(tlm_generic_payload& trans)
{
  return 0;
}
bool PERIPHERAL_B::get_direct_mem_ptr(tlm_generic_payload&
trans, tlm_dmi& dmi)
{
  return false;
}
// end of peripheral_b.cpp
// main.cpp
#include "peripheral_a.h"
#include "peripheral_b.h"
#define deltaT 10.0
#define ATUII_NUM 5
int sc_main(int argc, char **argv)
{
  PERIPHERAL_A *peri_a;
  PERIPHERAL_B *peri_b;
  peri_a = new PERIPHERAL_A("A");
  peri_b = new PERIPHERAL_B("B");
  // connect from peri_a to peri_b
  peri_a->i_socket(peri_b->t_socket);
  sc_start(200, SC_NS);
  delete peri_a;
  delete peri_b;
  return 0;
}
// end of main.cpp
```

Inter-module delay data 404 is a collection of data set by a user, including acceptable delay time between predetermined peripherals or between a predetermined peripheral and a predetermined plant. The inter-module delay data 404 is preferably stored in the hard disk drive 316 in the CSV format or an appropriate database format so that the set acceptable delay time will be searchable later using peripheral ID, plant ID, or the like.

A synchronization timing calculation module 406 refers to the hardware specifications 402 and the inter-module delay data 404 stored in the hard disk drive 316 to calculate synchronization timing in a strong coupling model, a weak coupling model, an aggregate model of synchronization cycle between peripherals, or an aggregate model of synchronization cycle between a peripheral and a plant to be described later.

Further, an ECU emulator 408 and a plant simulator 414 are stored in the hard disk drive 316, loaded to the main memory 306 upon startup of the computer, and executed by the operating system. Such an execution environment is indicated by a reference numeral 416.

In practice, the ECU emulator 408 consists of multiple ECU emulators, which correspond to the electromagnetic spill valve, the fuel cut solenoid, the timing control valve, the intake throttle VSV, the glow plug relay, the tachometer, the air conditioning relay, and the like, respectively. Each of the ECU emulators includes a CPU emulator 410 and a peripheral emulator 412, and the peripheral emulator 412 serves as an interface between the CPU emulator 410 and the plant simulator 414.

In practice, the plant simulator 414 also consists of multiple plant simulators, which correspond to an engine simulator, the transmission, the air conditioner, the brake, wiper, and the like, respectively.

As shown, the execution environment 416 refers to the synchronization timing calculation module 406 to operate a simulation system while setting synchronization timing between peripheral emulators or between a peripheral emulator and a plant simulator.

Figure 5:
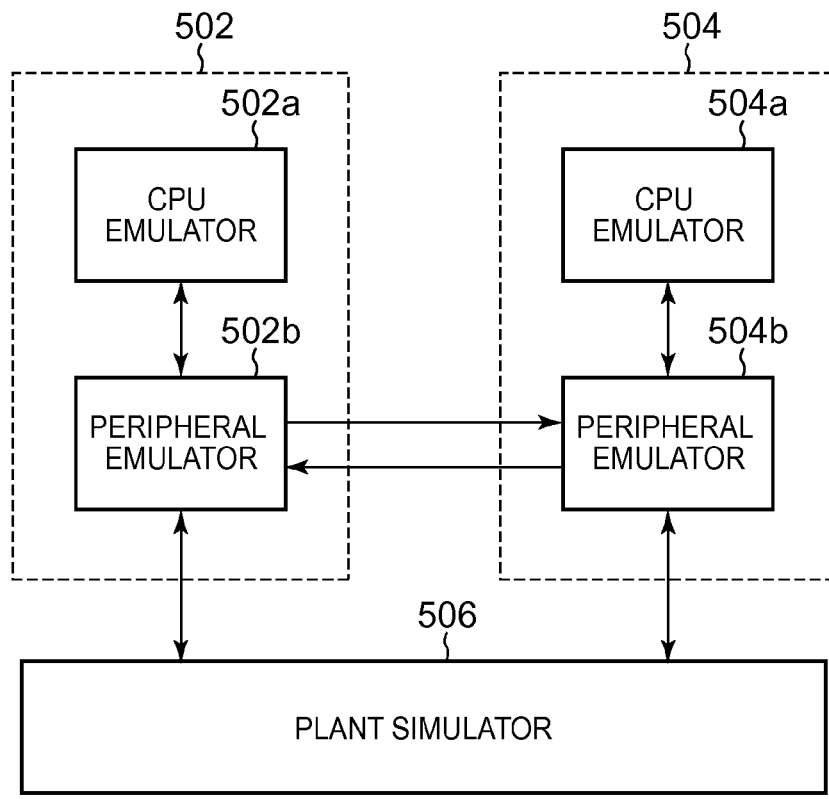
FIG. 5 is a diagram showing synchronous execution of ECU emulators and a plant simulator.

FIG. 5 is a diagram showing synchronous execution of an ECU emulator and a plant simulator. In FIG. 5, ECU emulators 502 and 504 are the same as that shown as the ECU emulator 408 in FIG. 4. For example, the ECU emulator 502 includes a CPU emulator 502*a* and a peripheral emulator 502*b*.

Although only two ECU emulators are shown in FIG. 5, forty or more ECU emulators may be connected in actual full-vehicle SILS.

The CPU emulator 502*a* communicates with a plant simulator 506 through the peripheral emulator 502*b*. Communication between the plant simulator 506 and the peripheral emulator 502*b* is performed using a common memory area allocated in the main memory 306 or through a CAN emulator (not shown).

Figure 6:
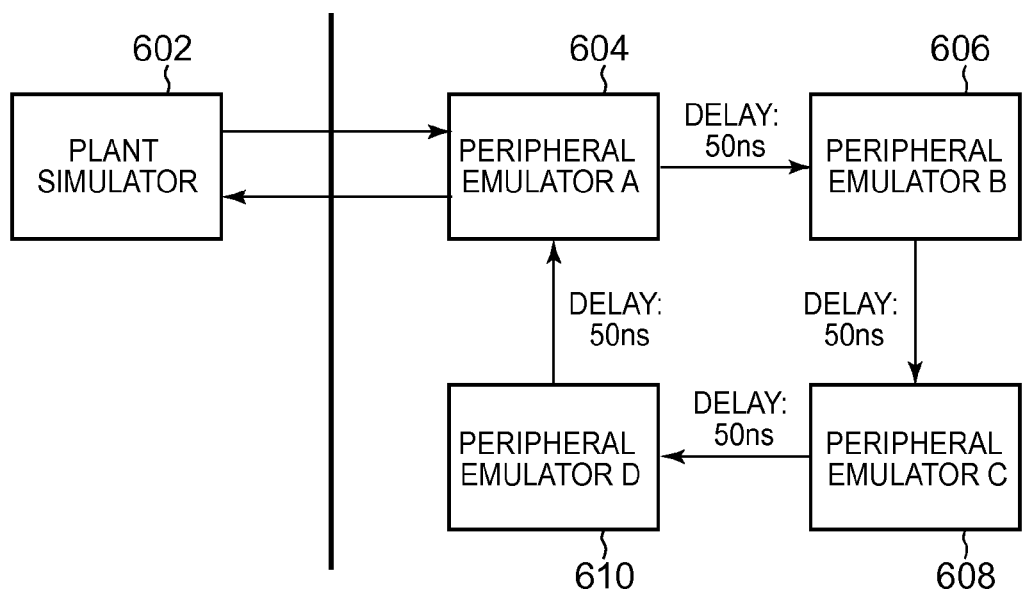
FIG. 6 is a diagram schematically showing communication between a plant simulator and a peripheral emulator, and communication between peripheral emulators.

FIG. 6 is a diagram schematically showing communication between a plant simulator and a peripheral emulator, and between peripheral emulators. Here, a plant simulator 602 and peripheral emulators 604 to 610 are shown.

In FIG. 6, it is assumed that the plant simulator 602 communicates with the peripheral emulator A 604 every 1 μs. Considering simulation for one second in a real machine, where it is assumed that each peripheral emulator runs every 5 ns, the simulation requires 20.40 s for one second in the real machine.

If it is assumed that each peripheral emulator runs every 100 ns by reducing synchronization cost between peripheral emulators, the time for the simulation for one second in the real machine is reduced to 5.85 s.

Further, if it is set that communication from the peripheral emulator A 604 to the plant simulator 602 is performed once every 1 μs, the time for the simulation is reduced to 1.60 s, and this speed is close to the actual time of the real machine. Thus, the present invention is intended to improve the simulation speed.

Figure 7:
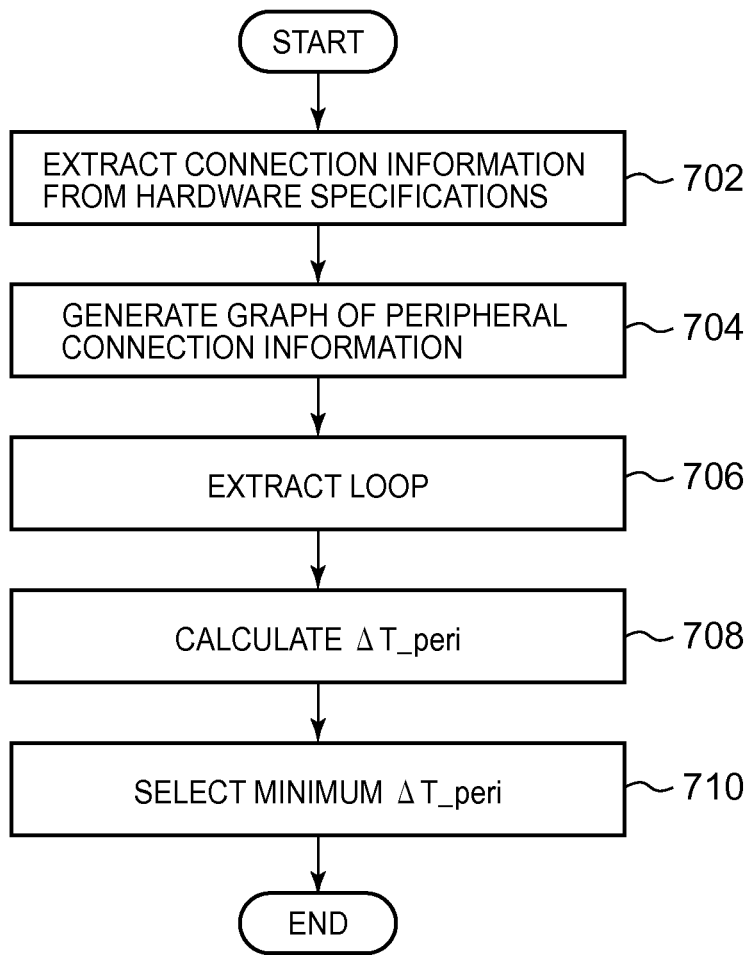
FIG. 7 is a flowchart showing processing for operation in a synchronization cycle $\Delta T\_peri$ to determine the synchronization cycle $\Delta T\_peri$ in a strong coupling model.

FIG. 7 is a flowchart of processing for operation in a synchronization cycle ΔT_peri to determine the synchronization cycle ΔT_peri in a strong coupling model. This processing is performed by the synchronization timing calculation module 406 shown in FIG. 4.

In step 702 of FIG. 7, the synchronization timing calculation module 406 is stored in the hard disk drive 316, and peripheral connection information is preferably extracted from the hardware specifications 402 as System C source code.

In the next step 704, based on the extracted information, the synchronization timing calculation module 406 generates a graph where nodes represent peripherals and edges represent connections between nodes, and stores, in the main memory 306, information including its data structure. At this time, processing time between peripherals based on the specifications is associated with each edge as a weight. Thus, the graph is a weighted graph.

In the next step 706, the synchronization timing calculation module 406 extracts a loop from the graph generated in step 704.

In other words, paths to be determined on the graph are set as (p0, . . . , pk). Then, if graphG≡(V,E) generated in step 704, where V is a set of nodes in the graph G and E is a set of edges in the graph G, such loops are extracted as meeting the following conditions:

$p_i \in V (0 \leq i \leq k)$ $(p_j p_{j+1}) \in E (0 \leq j \leq k)$ $p_0 = p_k$ Based on values obtained by adding processing times defined in the specifications on the loops thus determined, ΔT_peri is determined in step 708. A method of determining ΔT_peri is described in detail later with reference to FIG. 8.

In step 710, the minimum one of ΔT_peri calculated in each loop is stored anew as ΔT_peri in the main memory 306 or the hard disk drive 316 so that the stored ΔT_peri will be used for subsequent execution processing.

Figure 8A:
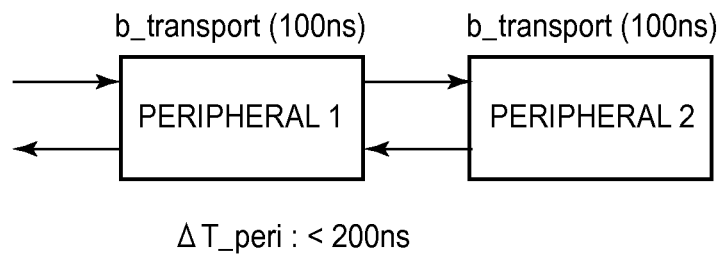
FIGS. 8A and 8B are diagrams for describing the maximum synchronization cycle.

Referring next to FIG. 8, the method of specifically determining ΔT_peri is described. Supposes first that a loop of peripheral 1 and peripheral 2 has been found as shown in FIG. 8A. Suppose further that communication time from peripheral 1 to peripheral 2 and communication time from peripheral 2 to peripheral 1 are both 100 ns on the specifications.

In this case, it takes at least 200 ns in total for communication from peripheral 1 to peripheral 2 and communication from peripheral 2 to peripheral 1 as a response.

Therefore, the synchronization cycle is set to be longer than 200 ns. This is because the longer the synchronization cycle, the more the simulation speed can be improved.

However, the synchronization cycle longer than 200 ns can include both an event of transmission from peripheral 1 and an event in which peripheral 1 receives communication from peripheral 2. Since the context of events occurring in one synchronization cycle cannot be checked, if two or more different events related to the same peripheral are included in one synchronization cycle, the causal relation therebetween cannot be guaranteed. In other words, this case will be "inaccurate synchronization cycle" as shown in FIG. 8B.

Figure 8B:
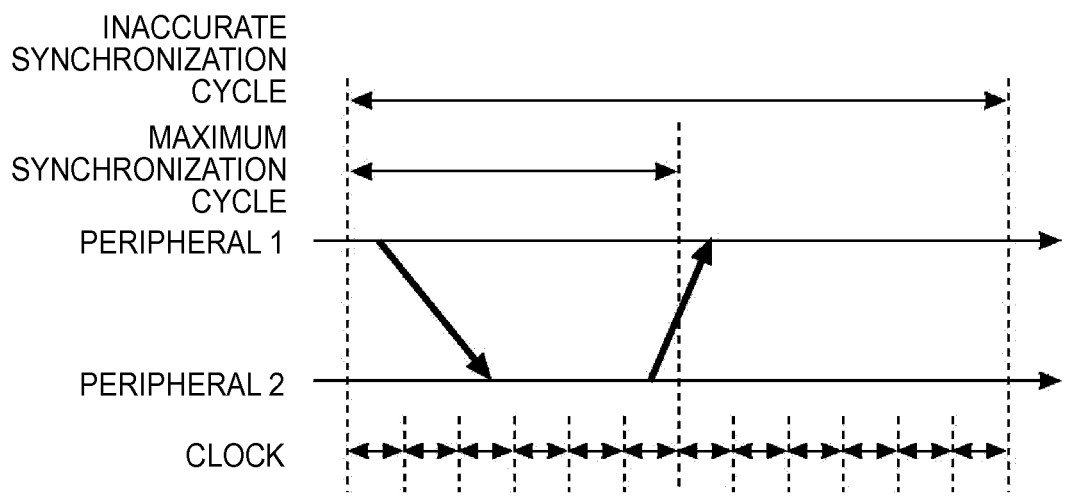

Therefore, if the synchronization cycle is set shorter than 200 ns, the event of transmission from peripheral 1 and the event in which peripheral 1 receives communication from peripheral 2 will fall within different synchronization cycles as shown in FIG. 8B, so that the causal relation can be maintained. As mentioned above, such a synchronization cycle is called the maximum synchronization cycle ΔT_peri.

Figure 9:
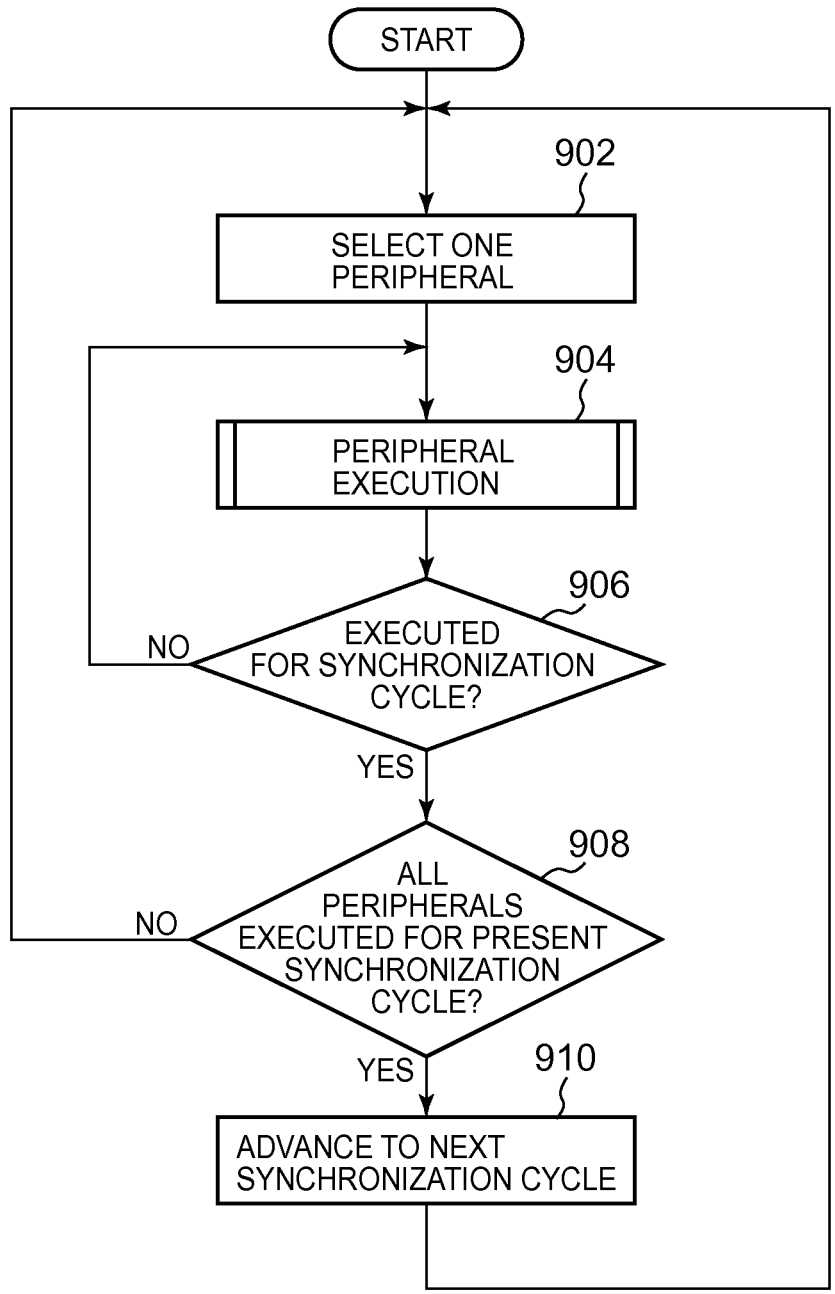
FIG. 9 is a flowchart showing execution processing based on the synchronization cycle obtained from the strong coupling model, particularly in the case of a runtime scheduler.

FIG. 9 is a flowchart showing execution processing based on the synchronization cycle obtained from the strong coupling model, particularly in the case of a runtime scheduler. In other words, this is to dispatch a peripheral execution code at the time of execution of a green thread library or the like. Here, green threads means threads in user space without support from the operating system, and a runtime library to handle green threads is called the green thread library. The following processing is performed by the execution environment 416 in FIG. 4.

In FIG. 9, one peripheral is selected at step 902. Then, in step 904, the selected peripheral is executed.

In step 906, it is determined whether the selected peripheral has been executed for the synchronization cycle ΔT_peri.

Here, the execution unit is one clock in FIG. 8B. If the peripheral has been executed for the synchronization cycle ΔT_peri, it is then determined in step 908 whether all peripherals have been executed for the present synchronization cycle, i.e., for ΔT_peri, and if not, the processing returns to step 902 to select the next peripheral.

If so, the processing goes to step 910 to advance to the next synchronization cycle. In other words, the simulation time is moved forward by the synchronization cycle.

Figure 10:
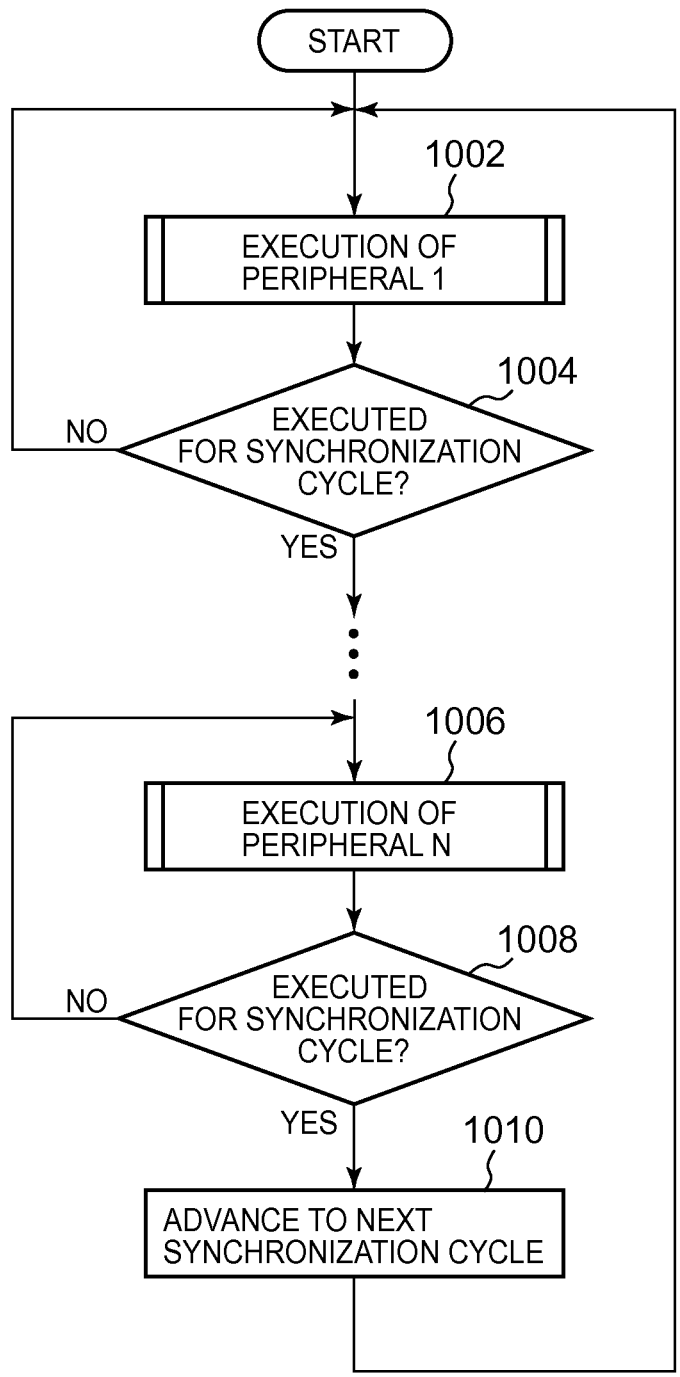
FIG. 10 is a flowchart showing execution processing based on the synchronization cycle obtained from the strong coupling model, particularly in the case of a static scheduler, i.e., in such a system that a code for dispatching peripheral execution codes the execution order of which is predetermined is generated in advance, and the code is executed.

FIG. 10 is a flowchart showing execution processing based on the synchronization cycle obtained from the strong coupling model, particularly in the case of a static scheduler, i.e., in such a system that a code for dispatching peripheral execution codes the execution order of which is predetermined is generated in advance, and the code is executed.

In FIG. 10, peripheral 1 is executed at step 1002. In step 1004, it is determined whether peripheral 1 has been executed for the synchronization cycle. If not, the processing returns to step 1002 to continue to execute peripheral 1. On the other hand, if it is determined that peripheral 1 has been executed for the synchronization cycle, it advances to the same processing for peripheral 2.

Thus, the processing progresses from peripheral 1, peripheral 2, to peripheral N in order, and in step 1006, peripheral N is executed. In step 1008, it is determined whether it has been executed for the synchronization cycle, and if not, the processing returns to step 1006 to continue to execute peripheral N. On the other hand, if it is determined that peripheral N has been executed for the synchronization cycle, the processing proceeds to step 1010 to advance to the next synchronization cycle, e.g., a synchronization cycle in a weak coupling scheme.

The following describes synchronization between peripherals in the weak coupling scheme. In simulation, where synchronization occurs every certain cycle, a delay occurs between peripherals in their time of occurrence. Therefore, a user who understands the delay describes an acceptable delay between particular peripherals beforehand into the inter-module delay data 404 of FIG. 4.

Then, the synchronization timing calculation module 406 looks up the acceptable delay between peripherals in a loop found in the same processing as that of the flowchart in FIG. 7, and includes the acceptable delay to calculate a relaxed synchronization cycle ΔT_peri'.

Figure 11A:
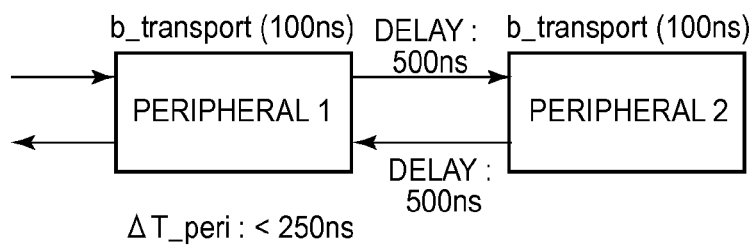
FIGS. 11A and 11B are diagrams for describing a relaxed synchronization cycle for weak coupling.

Suppose first that a loop of peripheral 1 and peripheral 2 has been found as shown in FIG. 11A. Suppose further that communication time from peripheral 1 to peripheral 2 and communication time from peripheral 2 to peripheral 1 are both 100 ns on the specifications. In addition, suppose that an acceptable delay specified by the user for communication from peripheral 1 to peripheral 2 and an acceptable delay specified by the user for communication from peripheral 2 to peripheral 1 are both 500 ns.

Figure 11B:
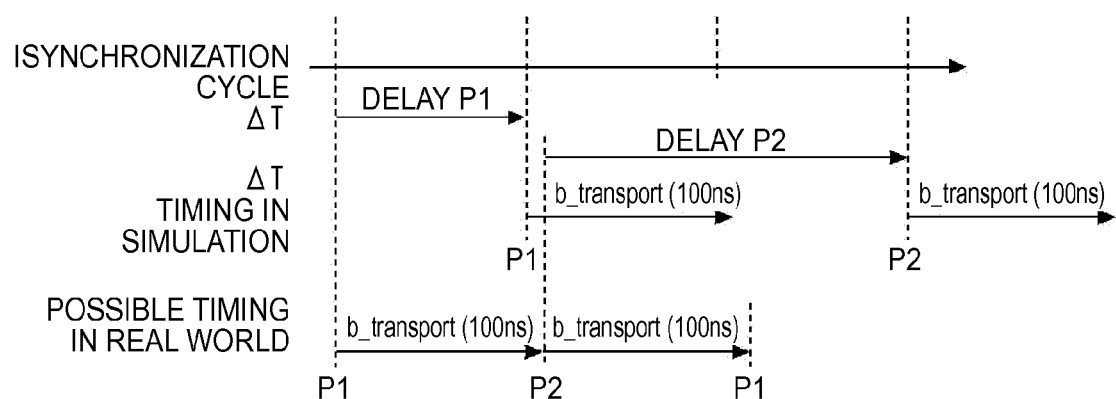

Then, as shown in a timing chart of FIG. 11B, a relaxed synchronization cycle ΔT_peri' is so determined that delay P1 at peripheral 1 and delay P2 at peripheral 2 will fall within the acceptable delay specified by the user while maintaining the causal relation. This does not correspond to any programming language in reality, but those skilled in the art will understand it without difficulty because it is based on the syntax of C language.

--- assume that loops are formed of peripherals $p_0, ..., p_m$
function path_len(i, j): function to obtain the length of a path from $p_i$ to $p_j$

```
function delay_allowed(i): function to obtain a delay acceptable at p_i
function roundup(u, d): function to return (n+1)*u when d≦(n+1)*u,
where n*u<d
ΔTp = ΔT_major // ΔT_major is the maximum synchronization cycle
obtained from the simulation environment
while (delay_allowed(0) < ΔTp) { // reduce ΔTp for the first peripheral
p0 to fall within the acceptable range
ΔTp /= 2;
}
step 1:
prev_time = 0; // prev_time is time in weak coupling simulation of p_{i-1}
for (i=1; i<m; i++) { // for second and all subsequent peripherals
    time = prev_time + roundup(ΔTp, path_len(i−1, i)); time is time in weak
coupling simulation of p_i
    delay = time − path_len(0, i); // deviation from timing in the real world
    if(delay_allowed(i) < delay) { // delay falls within the acceptable range?
        ΔTp /= 2; // if exceeding the acceptable range, decrease ΔTp by
half and retry
        go to step 1
    }
}
provide ΔTp as answer // when all peripherals fall within the acceptable
range,
ΔTp at the time is the answer
```

The value of ΔTp thus determined is stored as ΔT_peri' in the main memory 306 or the hard disk drive 316 in such a manner that the simulation system can refer to the value.

Figure 12A:
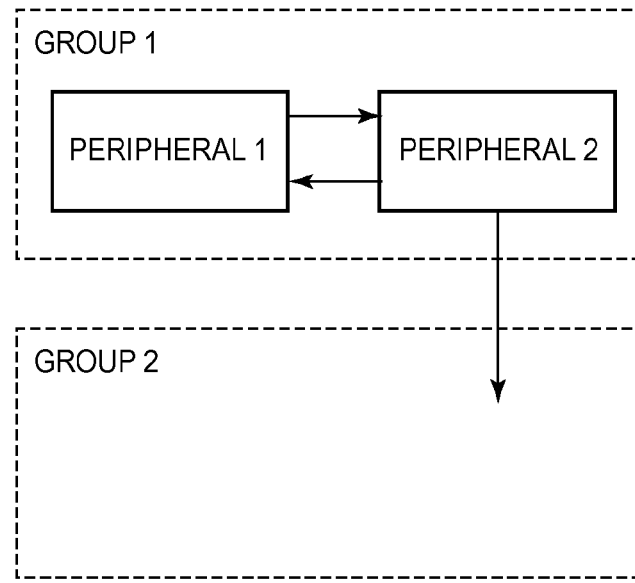
FIGS. 12A and 12B are diagrams for describing an aggregation of synchronization cycles.

Referring next to FIG. 12, an aggregation of synchronization cycles is described. As shown in FIG. 12A, there can be a case where peripherals in group 1 and peripherals in group 2, which form loops respectively, communication with each other.

Therefore, according to one finding of the present invention, since causality is closed is each group, it has been found that simulation can be performed correctly even if peripherals belonging to another group are operated using ΔT_major as the maximum synchronization cycle obtained from the simulation environment. Thus, the user writes it into the inter-module delay data 404.

Figure 12B:
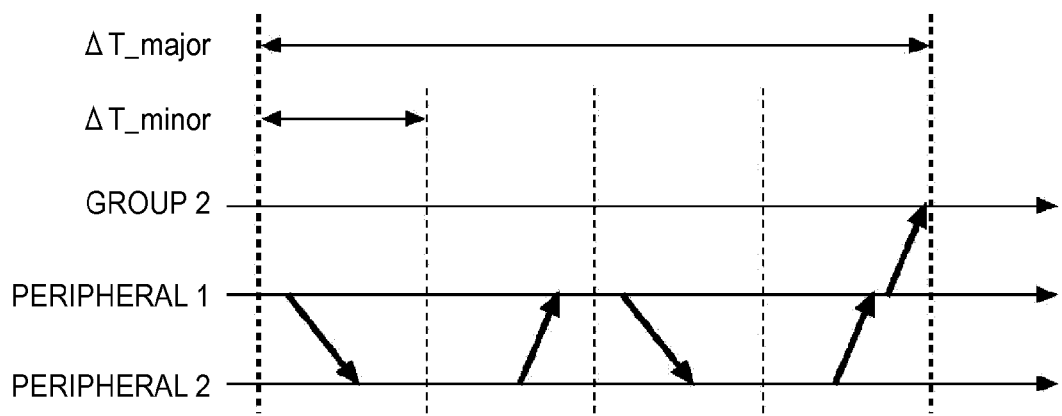

This state is shown in a timing chart of FIG. 12B. Here, ΔT_minor means ΔT_peri or ΔT_peri' mentioned above.

The following describes processing when peripherals are operated as an aggregation of synchronization cycles, i.e., using ΔT_minor and ΔT_major.

Figure 13:
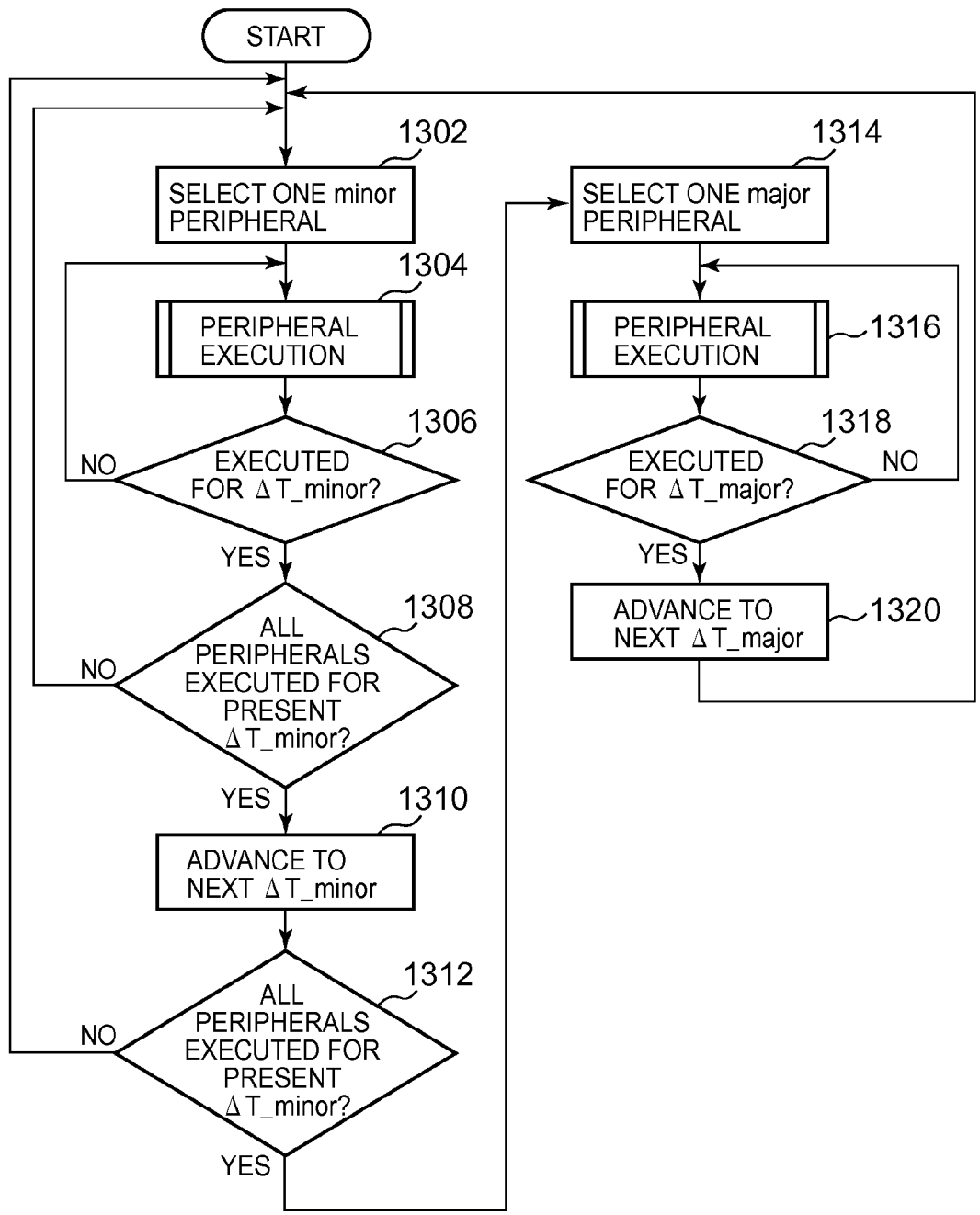
FIG. 13 is a flowchart showing processing in the case of the runtime scheduler.

FIG. 13 is a flowchart showing processing in the case of the runtime scheduler. In step 1302, the execution environment 416 selects one minor peripheral. The minor peripheral means a peripheral operated in a synchronization cycle ΔT_minor, and ΔT_minor is ΔT_peri or ΔT_peri' mentioned above. Here, the peripheral can be identified as a minor peripheral based on information from the synchronization timing calculation module 406.

In step 1304, the peripheral thus selected is executed. In step 1306, it is determined whether the selected has been executed for ΔT_minor, and if not, the processing in step 1304 is continued.

In step 1308, it is determined whether all peripherals have been executed for the present ΔT_minor, and if not, the processing returns to step 1302 to select the next minor peripheral. The minor peripheral is a peripheral operated in ΔT_minor.

If it is determined in step 1308 that all peripherals have been executed for the present ΔT_minor, processing advances to the next ΔT_minor in step 1310. In other words, the simulation time is moved forward by ΔT_minor.

In step 1312, it is determined whether all peripherals have been executed for the present ΔT_major, and if not, the processing returns to step 1302 to select the next minor peripheral. Here, ΔT_major is the maximum synchronization cycle obtained from the simulation environment. For example, ΔT_major is preset by the user in the inter-module delay data 404.

If it is determined in step 1312 that all peripherals have been executed for the present ΔT_major, the processing advances to step 1314 in which one major peripheral is selected. The major peripheral means a peripheral operated in ΔT_major. Here, the peripheral can be identified as a major peripheral based on information from the synchronization timing calculation module 406.

In step 1316, the selected major peripheral is executed. In step 1318, it is determined whether the selected peripheral has been executed for ΔT_major, and if not, the processing in step 1316 is continued.

If it is determined in step 1318 that the selected peripheral has been executed for ΔT_major, the simulation time is moved forward by ΔT_major in step 1320, and the processing returns to step 1302.

Figure 14:
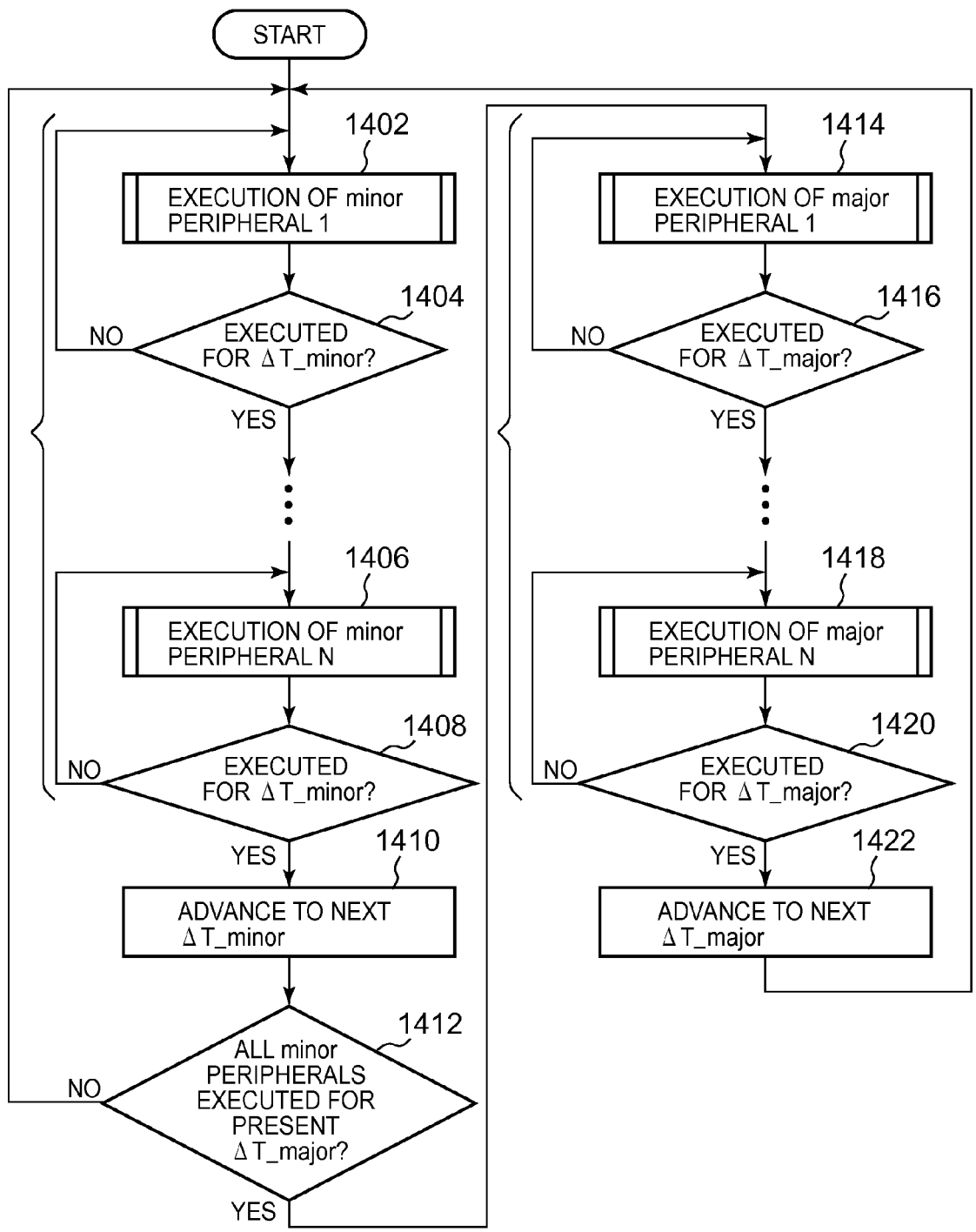
FIG. 14 is a flowchart showing processing in the case of the static scheduler.

FIG. 14 is a flowchart showing processing in the case of the static scheduler. In the processing of FIG. 14, minor peripheral 1 is executed at step 1402. Then, in step 1404, it is determined whether minor peripheral 1 has been executed for ΔT_minor, i.e., minor peripheral 1 is executed until ΔT_minor has elapsed. Here, the peripheral can be identified as a minor peripheral based on information from the synchronization timing calculation module 406.

The same processing is applied to minor peripheral 2, minor peripheral 3 . . . , and minor peripheral N is executed as shown in step 1406. Then, if it is determined in step 1408 that minor peripheral N has been executed for ΔT_minor, the time is moved forward by ΔT_minor in step 1410.

Then, in step 1412, if it is determined that all peripherals have been executed for the present ΔT_major, the processing advances to step 1414 in which major peripheral 1 is executed. Then, in step 1416, it is determined whether major peripheral 1 has been executed for ΔT_major, i.e., major peripheral 1 is executed until ΔT_major has elapsed. Here, the peripheral can be identified as a major peripheral based on information from the synchronization timing calculation module 406.

The same processing is applied to major peripheral 2, major peripheral 3, . . . , and major peripheral N is executed as shown in step 1418. Then, in step 1420, if it is determined that minor peripheral N has been executed for ΔT_major, the time is moved forward by ΔT_major in step 1422. Thus, the processing returns to step 1402.

Referring next to FIG. 15, synchronization with a plant in a weak coupling scheme is described. The user prerecords, in the inter-module delay data 404, previously known information about whether to permit a delay of aggregated synchronization cycle ΔT_major in communication between a peripheral and a plant.

Figure 15A:
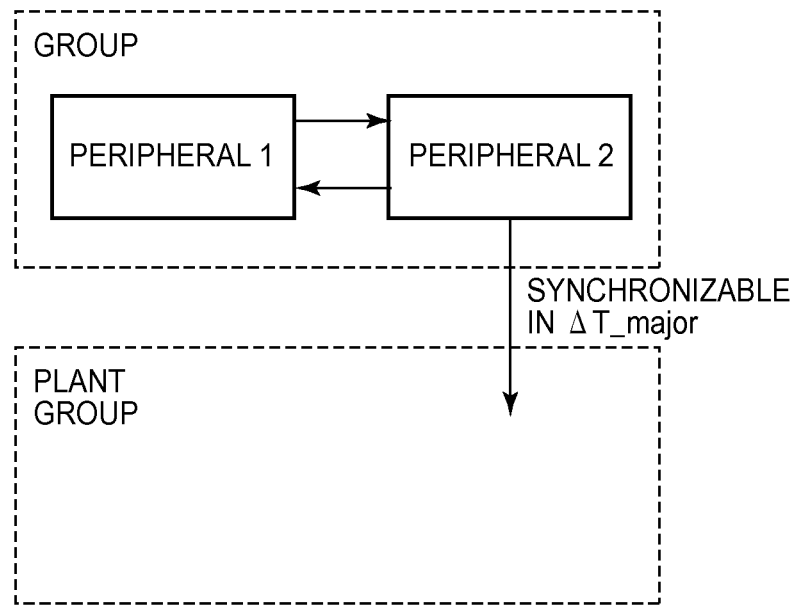
FIGS. 15A and 15B are diagrams for describing synchronization with a plant in a weak coupling scheme.

FIG. 15A shows that peripheral 2 and a plant group are synchronizable in ΔT_major.

Figure 15B:
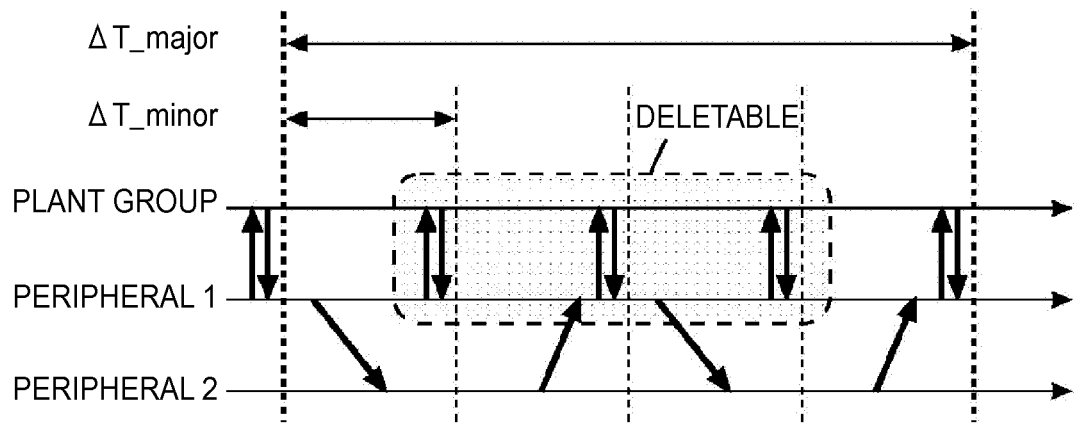

FIG. 15B shows that some communication between the peripheral and the plant within ΔT_major can be deleted (omitted) when the peripheral and the plant are synchronized in cycle ΔT_minor. In other words, if some communication is made omittable on the way, it can be found that the peripheral and the plant are communicable in ΔT_major.

Figure 16:
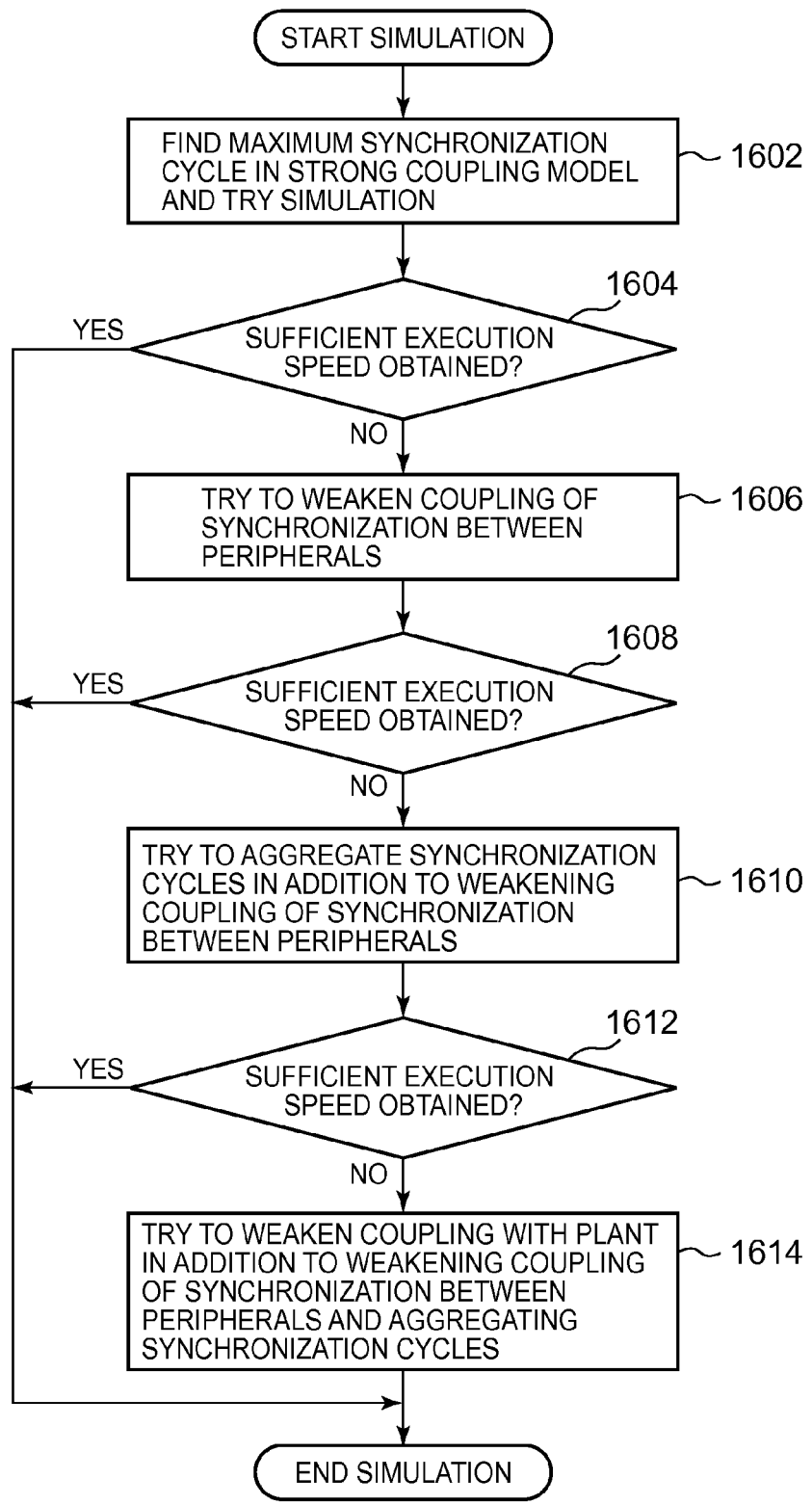
FIG. 16 is a flowchart for describing an entire scenario of processing.

FIG. 16 is a flowchart for describing the entire scenario of processing according to the present invention. This scenario is performed by the execution environment 416 while communicating with the synchronization timing calculation module 406. The synchronization timing calculation module 406 refers to the inter-module delay data 404 as required.

In step 1602 of FIG. 16, the execution environment 416 finds the maximum synchronization cycle in the strong coupling model from the processing of FIG. 7, and tries simulation in the processing of FIG. 9 or FIG. 10.

In step 1604, it is determined whether a sufficient execution speed has been obtained, and if so, simulation is ended.

If it is determined in step 1604 that the sufficient execution time cannot be obtained, the processing advances to step 1606 to try weak coupling between peripherals. Thus, based on the processing shown by the above-mentioned pseudo-code, ΔT_peri' for weak coupling is calculated, and simulation is tried by the processing of FIG. 9 or FIG. 10 using this ΔT_peri'.

In step 1608, it is determined whether a sufficient execution time has been obtained, and if so, simulation is ended.

If it is determined in step 1608 that the sufficient execution time cannot be obtained, the processing advances to step 1610 to try aggregation of synchronization cycles by the processing of FIG. 13 or FIG. 14 in addition to weak coupling between peripherals.

In step 1612, it is determined whether a sufficient execution time has been obtained, and if so, simulation is ended.

If it is determined in step 1612 that the sufficient execution time cannot be obtained, the processing advances to step 1614 to try weak coupling synchronization with the plant shown in FIG. 15 in addition to weak coupling between peripherals and aggregation of synchronization cycles. After that, simulation is ended.

While the present invention has been described by taking, as an example, communication between peripherals associated with ECU emulators, the present invention is also applicable to any other functional blocks that perform synchronous communication with each other.

The specific embodiment of the present invention has also been described in association with multiple simulation systems for an automobile, but the present invention is not intended to be limited to the specific embodiment. Those skilled in the art will appreciate that the present invention is applicable to simulation systems for control systems of general electronic machines, such as a simulation system for aircrafts.

What is claimed is:

1. A method of operating a system having a plurality of connected functional blocks, the method comprising the steps of:
   configuring a first graph in which nodes represent functional blocks, edges represent connection paths among functional blocks and weights represent communication times between functional blocks, the first graph being derived from connection relationships among the plurality of functional blocks and the communication times through the connection paths;
   finding closed paths in the first graph;
   determining the closed path having a lowest weight among the closed paths found;
   storing the lowest weight as a first synchronization timing;
   synchronizing the plurality of functional blocks at the first synchronization timing;
   determining a second synchronization timing for a second graph, the second synchronization timing including an acceptable delay added to the communication times in the first graph;
   synchronizing the plurality of functional blocks at the second synchronization timing;
   determining whether synchronization between the plurality of functional blocks and an external interface is allowed at a third synchronization timing that is specified by a user and is longer than the first and second synchronization timings; and
   synchronizing the plurality of functional blocks and the external interface at the third synchronization timing in a portion indicated to be able to accept the third synchronization timing between the functional blocks and the external interface in the second graph,
   wherein each of the foregoing steps is performed with a data processing machine.

2. The method according to claim 1, wherein the acceptable delay is determined by a value set for a predetermined functional block in storage means of the computer.

3. The method according to claim 1, wherein the determination as to whether the synchronization is allowed is based on the value set for the predetermined functional block in the storage means of the computer.

4. The method according to claim 1, further comprising the steps of:
   determining whether a desired operation speed can be obtained as a result of operating the system at the first synchronization timing;
   determining whether a desired operation speed can be obtained as a result of operating the system at the second synchronization timing if the desired operation speed cannot be obtained as a result of operating the system at the first synchronization timing; and
   operating the system at the third synchronization timing if the desired operation speed cannot be obtained as a result of operating the system at the second synchronization timing.

5. A non-transitory storage medium tangibly embodying a computer program that, when executed with a computer, causes the computer to execute the steps of:
   configuring a first graph in which nodes represent functional blocks, edges represent connection paths among functional blocks and weights represent communication times between functional blocks, the first graph being derived from connection relationships among the plurality of functional blocks and the communication times through the connection paths;
   finding closed paths in the first graph;
   determining the closed path having a lowest weight among the closed paths found;
   storing the lowest weight as a first synchronization timing;
   synchronizing the plurality of functional blocks at the first synchronization timing;
   determining a second synchronization timing for a second graph, the second synchronization timing including an acceptable delay added to the communication times in the first graph;
   synchronizing the plurality of functional blocks at the second synchronization timing;
   determining whether synchronization between the plurality of functional blocks and an external interface is allowed at a third synchronization timing that is specified by a user and is longer than the first and second synchronization timings; and
   synchronizing the plurality of functional blocks and the external interface at the third synchronization timing in a portion indicated to be able to accept the third synchronization timing between the functional blocks and the external interface in the second graph.

6. The non-transitory storage medium according to claim 5, wherein the acceptable delay is determined by a value set for a predetermined functional block in storage means of the computer.

7. The non-transitory storage medium according to claim 5, wherein the determination as to whether the synchronization is allowed is based on the value set for the predetermined functional block in the storage means of the computer.

8. The storage medium according to claim 5, wherein the program embodied by the storage medium further causes the computer to execute the steps of:
   determining whether a desired operation speed can be obtained as a result of operating the system at the first synchronization timing;
   determining whether a desired operation speed can be obtained as a result of operating the system at the second synchronization timing if the desired operation speed cannot be obtained as a result of operating the system at the first synchronization timing; and
   operating the system at the third synchronization timing if the desired operation speed cannot be obtained as a result of operating the system at the second synchronization timing.

9. A system including a plurality of connected functional blocks, the system comprising:
   means for configuring, with a computer, a first graph, where functional blocks are represented as nodes, connection paths are represented as edges and communication times between functional blocks are represented by weights, from connection relationships among the plurality of functional blocks and the communication times through the connection paths;
   means for finding, with the computer, closed paths in the first graph;
   means for determining, with the computer, a closed path having a lowest weight among the closed paths found;
   means for storing, with the computer, the lowest weight as a first synchronization timing;
   means for synchronizing, with the computer, the plurality of functional blocks at the first synchronization timing;
   means for determining, with the computer, a second synchronization timing for a second graph the second synchronization timing including an acceptable delay added to the communication times in the first graph;
   means for synchronizing, with the computer, the plurality of functional blocks at the second synchronization timing;
   means for determining, with the computer, whether synchronization between the plurality of functional blocks and an external interface is allowed at a third synchronization timing that is specified by a user and is longer than the first and second synchronization timings; and
   means for synchronizing, with the computer, the plurality of functional blocks and the external interface at the third synchronization timing in a portion indicated to be able to accept the third synchronization timing between the functional blocks and the external interface in the second graph.

10. The system according to claim 9, wherein the acceptable delay is determined by a value set for a predetermined functional block in storage means of the computer.

11. The system according to claim 9, wherein the determination as to whether the synchronization is allowed is made based on the value set for the predetermined functional block in the storage means of the computer.

12. The system according to claim 9, further comprising:
   means for determining, with the computer, whether a desired operation speed can be obtained as a result of operating the system at the first synchronization timing;
   means for determining, with the computer, whether a desired operation speed can be obtained as a result of operating the system at the second synchronization timing if the desired operation speed cannot be obtained as a result of operating the system at the first synchronization timing; and
   means for operating, with the computer, the system at the third synchronization timing if the desired operation speed cannot be obtained as a result of operating the system at the second synchronization timing.

* * * * *